(12) United States Patent
Yamashita et al.

(10) Patent No.: US 6,914,824 B2
(45) Date of Patent: Jul. 5, 2005

(54) NON-VOLATILE SEMICONDUCTOR MEMORY THAT IS BASED ON A VIRTUAL GROUND METHOD

(75) Inventors: Minoru Yamashita, Kawasaki (JP); Yuichi Einaga, Kawasaki (JP); Kazunari Kido, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/392,912

(22) Filed: Mar. 21, 2003

(65) Prior Publication Data
US 2003/0179628 A1 Sep. 25, 2003

(30) Foreign Application Priority Data
Mar. 22, 2002 (JP) ........................................ 2002-080554

(51) Int. Cl.$^7$ .............................................. G11C 16/06
(52) U.S. Cl. .............................. 365/185.25; 365/185.11; 365/185.26
(58) Field of Search ........................ 365/185.25, 185.11, 365/185.26

(56) References Cited

U.S. PATENT DOCUMENTS 6,487,124 B2 * 11/2002 Semi ...................... 365/185.25
6,496,414 B2 * 12/2002 Kasa et al. ............. 365/185.11
6,512,692 B2 *  1/2003 Yamauchi et al. ...... 365/185.11

FOREIGN PATENT DOCUMENTS

JP             11-110987           4/1999

* cited by examiner

Primary Examiner—Hoai V. Ho
(74) Attorney, Agent, or Firm—Arent Fox PLLC

(57) ABSTRACT

A semiconductor memory that prevents a decrease in margin at read time. A bit line in a floating state between a drain in a memory cell to be read and a charged bit line is charged for a certain period of time.

8 Claims, 7 Drawing Sheets

NON-VOLATILE SEMICONDUCTOR MEMORY THAT IS BASED ON A VIRTUAL GROUND METHOD

CROSS-REFERENCE TO RELATED APPLICATIONS

This application is based upon and claims priority of Japanese Patent Application No. 2002-080554, filed on Mar. 22, 2002, the contents being incorporated herein by reference.

BACKGROUND OF THE INVENTION (1) Field of the Invention

This invention relates to a semiconductor memory and, more particularly, to a nonvolatile semiconductor memory based on a virtual ground method.

(2) Description of the Related Art

In recent years large-capacity and highly-integrated memories have been required. As a result, nonvolatile semiconductor memories based on a multi value method, a virtual ground method, and the like in which effective cell area can be reduced have been developed and put to practical use.

Semiconductor memories based on a virtual ground method have a structure in which two memory cells share one bit line, so high integration levels can be attained.

FIG. 5 is a view showing the rough structure of part of a conventional nonvolatile semiconductor memory based on a virtual ground method.

A semiconductor memory 30 includes a virtual ground line VRG, a sense amplifier 31, a cascode circuit 32, a precharge circuit 33, and a selection circuit 34 and has a structure in which memory cells M1 through M5 are connected in parallel among a plurality of bit lines BL1 through BL6 intersecting a word line WL. A gate in each of the memory cells M1 through M5 is connected to the word line WL. A drain in each of the memory cells M1 through M5 is connected to one of the bit lines BL1 through BL6. A source in each of the memory cells M1 through M5 is also connected to one of the bit lines BL1 through BL6.

Now, operation performed when the memory cell M2 is read will be described.

When the memory cell M2 is read, a voltage of, for example, 5 V is applied first to the word line WL. Then the memory cells M1 through M5 will go into the ON state. Moreover, the virtual ground line VRG is connected by the selection circuit 34 to the bit line BL2 connected to a source s1 of the memory cell M2. The cascode circuit 32 is connected by the selection circuit 34 to the bit line BL3 connected to a drain d1 of the memory cell M2. A voltage of, for example, 1 V is applied to the bit line BL3 connected to the drain d1.

The precharge circuit 33 is connected by the selection circuit 34 to the opposite bit line BL4 connected to the memory cell M3, which is adjacent to the memory cell M2 and which shares the bit line BL3 connected to the drain d1 of the memory cell M2, to charge the bit line BL4 so that its potential will be equal to that of the drain d1 of the memory cell M2. This prevents an electric current Ic which runs through the bit line BL3 from flowing to the memory cell M3 not selected. The bit lines BL1, BL5, and BL6 connected to the memory cells M1, M4, and M5, respectively, are in a floating state, that is to say, they are not connected to power or virtual ground.

When the memory cell M2 is in a write state (PGM state), that is to say, when the memory cell M2 stores "0," an electric current Ids which flows between the drain d1 and source s1 in the memory cell M2 is not powerful. On the other hand, when the memory cell M2 is in an erase state (ERASE state), that is to say, when the memory cell M2 stores "1," the electric current Ids is powerful. The cascode circuit 32 converts the electric current Ic which runs through the bit line BL3 to voltage and inputs it to the sense amplifier 31. The sense amplifier 31 is connected to a reference circuit (not shown). The sense amplifier 31 judges by comparing a reference current which flows through the reference circuit and a reference signal input to the sense amplifier 31 whether the memory cell M2 is in a PGM state or in an ERASE state, and outputs the result of judgment as data.

It is assumed that a reference current of 15 μA is passed through the reference circuit (not shown). If the value of the electric current Ic which runs through the bit line BL3 is greater than 15 μA, then the sense amplifier 31 judges that the memory cell M2 is in an ERASE state. If the value of the electric current Ic which runs through the bit line BL3 is smaller than 15 μA, then the sense amplifier 31 judges that the memory cell M2 is in a PGM state.

To prevent an error in judgment, usually some margin will be left. It is assumed that an electric current of 10 μA flows in a PGM state and that an electric current of 20 μA flows in an ERASE state. Moreover, as described above, it is assumed that a reference current of 15 μA is passed through the reference circuit. Then a margin of ±5 μA will be left.

However, the conventional semiconductor memory 30 has the following problems.

FIG. 6 is a view showing the rough structure of part of the semiconductor memory in which a combination of storage states of memory cells is made.

As shown in FIG. 6, operation performed at read time in a case where the memory cell M2 is in a PGM state and where the memory cells M3, M4, and M5 are in an ERASE state will be described first.

When the memory cell M2 is read, it is in a PGM state and an electric current which flows between the drain d1 and source s1 in the memory cell M2 is not powerful. Therefore, the potential of the drain d1 is slightly higher. At this time, the memory cell M3, which is on the drain d1 side and which is adjacent to the memory cell M2, is in an ERASE state. The memory cell M4 next to the memory cell M3 is also in an ERASE state. A powerful electric current flows in an ERASE state. Therefore, the potential of the bit line BL4 connected to the memory cell M3 which is charged so that its potential will be equal to that of the drain d1 is slightly lower. As a result, an electric current Idp will flow from the drain d1 to the memory cell M3. The sense amplifier 31 judges the storage state of the memory cell M2 on the basis of the electric current Ic which runs through the bit line BL3. Therefore, if the electric current Ic which runs through the bit line BL3 for reading is given by Ids+Idp, the value of the electric current Ic appears to be greater than that of the electric current Ids which originally flows between the drain d1 and source s1 in the memory cell M2.

It is assumed that the value of a reference current, which flows through the reference circuit (not shown) and which is used by the sense amplifier 31 for comparison, is 15 μA, that usually the value of Ids is 10 μA in a PGM state and 20 μA in an ERASE state, and that a margin of 5 μA is left in each state. Then Idp will decrease this margin. If Idp exceeds 5 μA, the sense amplifier 31 will judge the memory cell M2 to be in an ERASE state, but in reality it is in a PGM state.

FIG. 7 is a view showing the rough structure of part of the semiconductor memory in which another combination of storage states of memory cells is made.

Now, operation performed at read time in a case where the memory cells M2 and M3 are in an ERASE state and where the memory cells M4 and M5 are in a PGM state will be described.

In this case, the memory cell M2 to be read is in an ERASE state and a powerful electric current flows between the drain d1 and source s1 in the memory cell M2. Therefore, the voltage of the drain d1 is slightly lower. At this time the memory cell M3, which is on the drain d1 side and which is adjacent to the memory cell M2, is in an ERASE state. The memory cell M4 next to the memory cell M3 is in a PGM state. As a result, an electric current which runs through the bit line BL4 is not powerful and the voltage of the bit line BL4 connected to the memory cell M3 is slightly higher. Therefore, the electric current Idp will flow from the bit line BL4 on the memory cell M3 side to the drain d1. The sense amplifier 31 judges the storage state of the memory cell M2 on the basis of the electric current Ic which runs through the bit line BL3. Accordingly, if the electric current Ic which runs through the bit line BL3 for reading is given by Ids–Idp, the value of the electric current Ic appears to be smaller than that of the electric current Ids which originally flows between the drain d1 and source s1 in the memory cell M2.

It is assumed that the value of a reference current, which flows through the reference circuit (not shown) and which is used by the sense amplifier 31 for comparison, is 15 $\mu$A, that usually the value of Ids is 10 $\mu$A in a PGM state and 20 $\mu$A in an ERASE state, and that a margin of 5 $\mu$A is left in each state. Then Idp will decrease this margin. If Idp exceeds 5 $\mu$A, the sense amplifier 31 will judge the memory cell M2 to be in a PGM state, but in reality it is in an ERASE state.

SUMMARY OF THE INVENTION

The present invention was made under the background circumstances as described above. An object of the present invention is to provide a semiconductor memory in which a decrease in reading margin at the time of a memory being read is prevented.

In order to achieve the above object, a nonvolatile semiconductor memory based on a virtual ground method is provided. This semiconductor memory comprises a plurality of memory cells arranged like a matrix, a plurality of bit lines each connected to sources or drains of memory cells arranged in a column direction, a plurality of word lines each intersecting the plurality of bit lines and each connected to gates of memory cells arranged in a row direction, a current supply circuit for supplying an electric current at read time by connecting with a bit line connected to a drain of a selected memory cell, a precharge circuit for charging at read time a bit line connected to a side opposite a first non-selected memory cell of a second non-selected memory cell adjacent to the first non-selected memory cell which shares the bit line connected to the drain of the selected memory cell, and a charge circuit for charging a bit line shared by the first non-selected memory cell and the second non-selected memory cell only for a certain period of time at read time.

The above and other objects, features and advantages of the present invention will become apparent from the following description when taken in conjunction with the accompanying drawings which illustrate preferred embodiments of the present invention by way of example.

DESCRIPTION OF THE PREFERRED EMBODIMENTS

Embodiments of the present invention will now be described with reference to the drawings.

Figure 1:
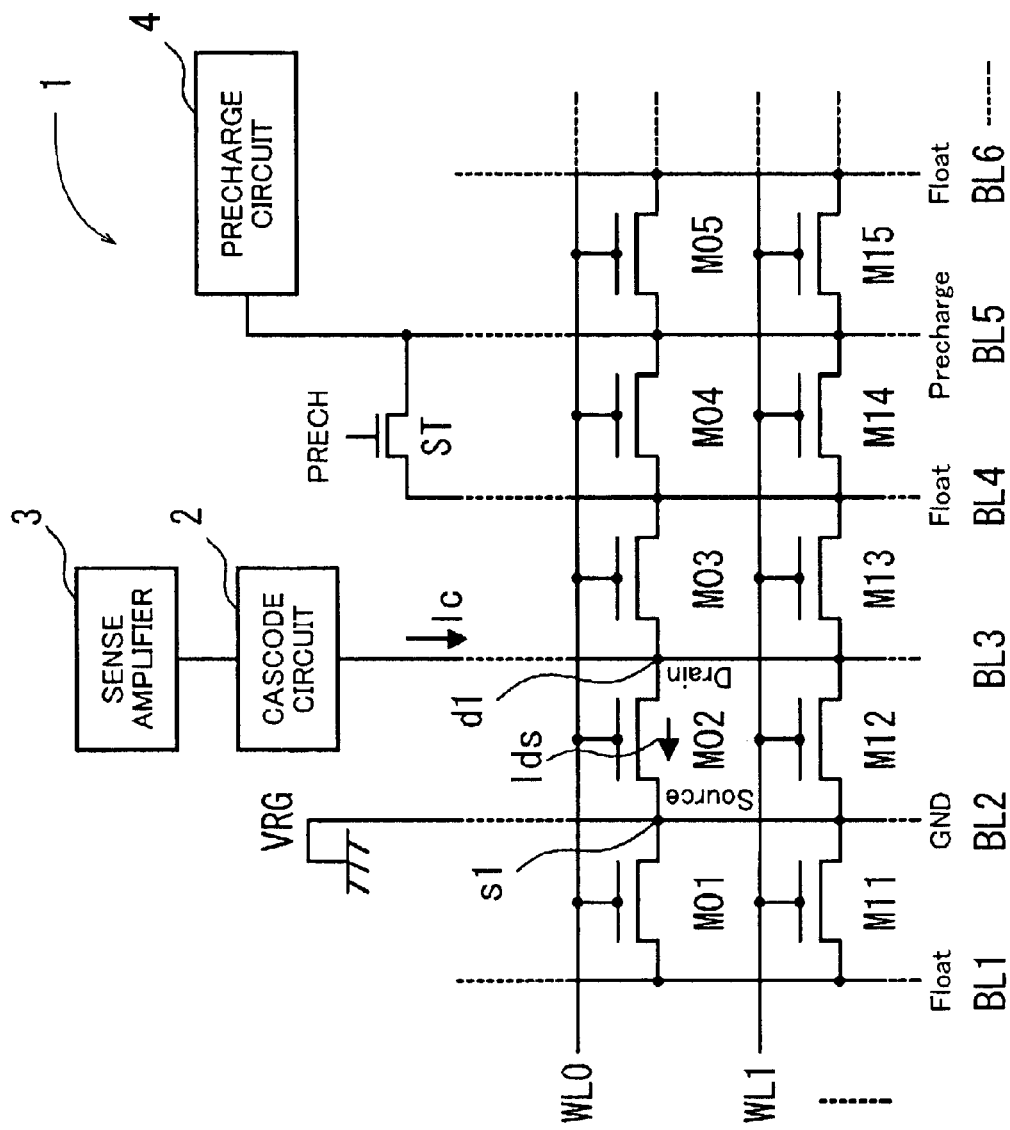
FIG. 1 is a view showing the rough structure of a semiconductor memory according to the present invention.

FIG. 1 is a view showing the rough structure of a semiconductor memory according to the present invention.

A semiconductor memory 1 includes a plurality of memory cells Mmn ("m" is a natural number and "n" is a natural number except zero) arranged like a matrix. There are word lines WLm (this "m" corresponds to "m" in the memory cells "Mmn") which are connected to gates of the memory cells Mmn and bit lines BLn (this "n" corresponds to "n" in the memory cells "Mmn") which are intersecting the word lines WLm and which are connected to sources or drains of the memory cells Mmn. These memory cells Mmn, word lines WLm, and bit lines BLn form a memory cell array.

Moreover, to write data to or read data from the memory cells Mmn, the semiconductor memory 1 includes a cascode circuit 2 having a current source for supplying an electric current to the memory cells Mmn, a sense amplifier 3 for judging the storage state of a selected memory cell Mmn, a precharge circuit 4 having a built-in current source for charging the bit lines BLn, and a plurality of selection transistors ST for selecting the cascode circuit 2, or the precharge circuit 4, or a virtual ground line VRG which should be connected to the bit lines BLn. For convenience of explanation only one selection transistor ST that selects the bit line BL4 is shown in FIG. 1. Furthermore, it is assumed that the virtual ground line VRG, cascode circuit 2, and precharge circuit 4 are connected to the bit lines BL2, BL3, and BL5 respectively. The details of this connection will be described later.

Now, operation performed in the semiconductor memory 1 will be described with a case where data ("0" or "1") stored in the memory cell M02 is read as an example.

To read data from the memory cell M02, voltage (3 V, for example) is applied first to the word line WL0. As a result, the memory cell M02 goes into the ON state. Then a drain-to-source current Ids (hereinafter referred to simply as Ids) flows through the memory cell M02 by the virtual ground line VRG connected to the bit line BL2 on the source s1 side of the memory cell M02 and the cascode circuit 2 connected to the bit line BL3 on the drain d1 side of the memory cell M02. When the memory cell M02 is in a write state (PGM state), a threshold is great and therefore Ids is weak. On the other hand, when the memory cell M02 is in an erase state (ERASE state), a threshold is small and therefore Ids is powerful. In this case, the bit lines BL1, BL4, BL6, . . . are in a floating state.

To prevent an electric current from flowing out from the memory cell M02, the bit line BL5 is charged by the precharge circuit 4 so that the potential of the bit line BL5 will be equal to that of the bit line BL3 connected to the memory cell M02.

By locating the bit line BL4 in a floating state between the bit line BL3 connected to the drain d1 of the memory cell M02 to be read and the bit line BL5 charged, an electric current which flows between the drain and bit line BL5 can be decreased and the amount of a decrease in reading margin can be reduced. In this case, however, the bit line BL4 in a floating state between the bit lines BL3 and BL5 is charged via the memory cell M04, so the bit line BL4 cannot be charged sufficiently during read time. As a result, an electric current which flows alternatingly between the drain and bit line BL4 will become powerful and therefore a reading margin will decrease.

Therefore, by keeping the selection transistor ST connected to the bit line BL4 in the ON state with a precharge signal supplied from the outside only for a certain period of time after the beginning of reading and charging the bit line BL4 in a floating state by the precharge circuit 4, the potential of the bit lines BL4 is made equal to that of the bit lines BL3.

The sense amplifier 3 compares a reference signal obtained by converting a reference current Iref (hereinafter referred to simply as Iref) which flows through a reference circuit (not shown) into voltage and an input signal obtained by converting an electric current Ic which runs through the bit lines BL3 into voltage in the cascode circuit 2. If Ic<Iref, then the sense amplifier 3 judges that the memory cell M02 is in a PGM state, that is to say, the memory cell M02 stores "0". If Ic>Iref, then the sense amplifier 3 judges that the memory cell M02 is in an ERASE state, that is to say, the memory cell M02 stores "1". It is assumed that the value of Ids is 10 $\mu$A in a PGM state and 20 $\mu$A in an ERASE state and that the value of Iref is 15 $\mu$A. Then the sense amplifier 3 can judge with a margin of 5 $\mu$A left whether the memory cell M02 stores "0" or "1".

As described above, by locating the bit line BL4 in a floating state between the drain d1 of the memory cell M02 selected for reading and the bit line BL5 connected to and charged by the precharge circuit 4 and charging the bit line BL4 by the precharge circuit 4 only for a certain period of time after the beginning of reading, an electric current is prevented from flowing into or out of the memory cell M02. As a result, a decrease in reading margin is prevented and judging a piece of data as another piece of data is prevented regardless of the storage states of adjacent memory cells.

Descriptions have been given with a case where the bit line BL4 in a floating state is charged by the current source included in the precharge circuit 4 as an example. By connecting the cascode circuit 2 and selection transistor ST, however, the bit line BL4 in a floating state may be charged by the current source included in the cascode circuit 2 with a precharge signal supplied from the outside for a certain period of time.

An embodiment of the present invention will now be described in detail.

Figure 2:
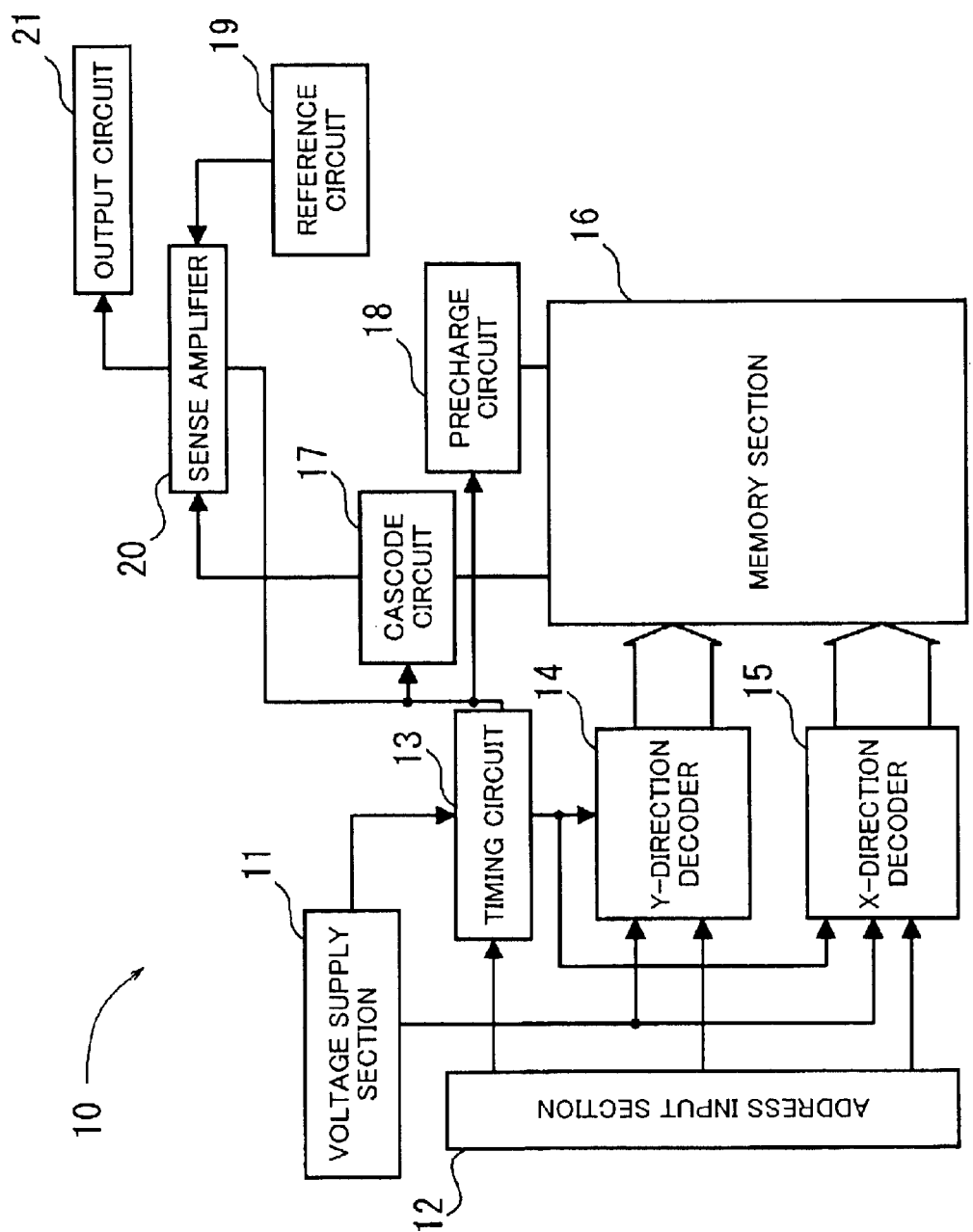
FIG. 2 is a view showing the structure of a semiconductor memory.

FIG. 2 is a view showing the structure of a semiconductor memory according to an embodiment of the present invention.

Figure 3:
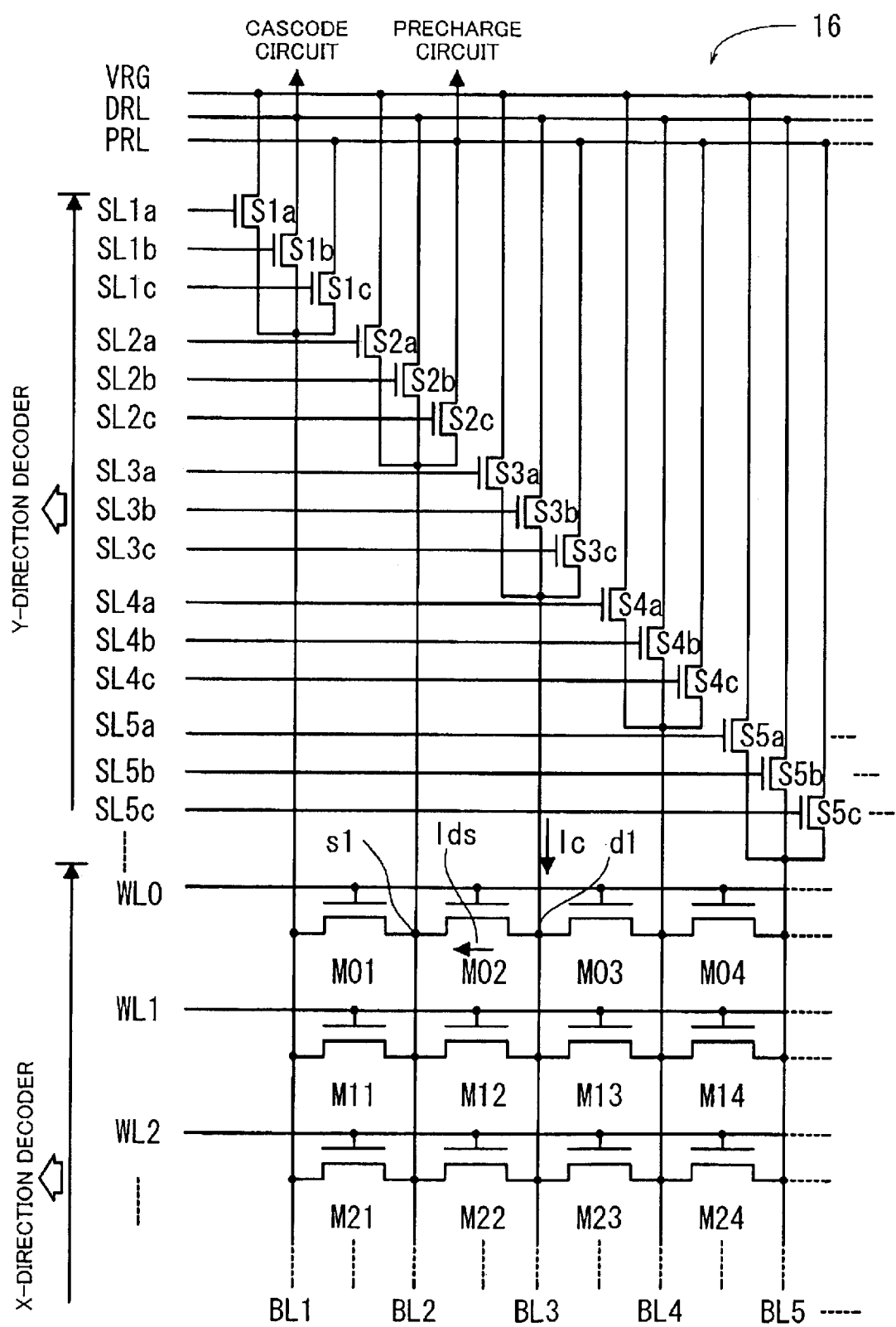
FIG. 3 is a view showing the structure of a memory section in the semiconductor memory.

FIG. 3 is a view showing the structure of a memory section in the semiconductor memory.

Now, descriptions will be given with FIGS. 2 and 3.

A semiconductor memory 10 comprises a voltage supply section 11, an address input section 12, a timing circuit 13 for generating a timing signal, a Y-direction decoder 14 and X-direction decoder 15 for selecting an address input from the address input section 12, a memory section 16 for storing digital data, a cascode circuit 17 including a current source for supplying an electric current to the memory section 16, a precharge circuit 18 for charging a bit line BLn described later in the case of reading, a reference circuit 19 for sending a reference current compared with an electric current flowing to the memory section 16, a sense amplifier 20 for comparing an electric current flowing to the memory section 16 and an electric current flowing to the reference circuit 19, and an output circuit 21 for outputting comparison result.

As shown in FIG. 3, the memory section 16 includes a plurality of memory cells Mmn ("m" is a natural number and "n" is a natural number except zero) arranged like a matrix. There are word lines WLm (this "m" corresponds to "m" in the memory cells "Mmn") which are connected to gates of the memory cells Mmn and bit lines BLn (this "n" corresponds to "n" in the memory cells "Mmn") which are intersecting the word lines WLm and which are connected to sources or drains of the memory cells Mmn. These memory cells, word lines, and bit lines form a memory cell array.

In addition, the memory section 16 includes selection transistors Sna, Snb, and Snc (these "n"s correspond to "n" in the bit lines "BLn" and are natural numbers except zero) for selecting a virtual ground line VRG, or a drain line DRL, or a precharge line PRL which should be connected to the bit lines BLn. Moreover, the memory section 16 includes selection lines SLna, SLnb, and SLnc for operating the plurality of selection transistors Sna, Snb, and Snc respectively and the selection lines SLna, SLnb, and SLnc are connected to the Y-direction decoder 14. The word lines WLm are connected to the X-direction decoder 15. The drain line DRL and precharge line PRL are connected to the cascode circuit 17 and precharge circuit 18 respectively. The voltage of the virtual ground line VRG is at ground level (0 V).

Each of the memory cells Mmn is a nonvolatile MOS memory. This nonvolatile MOS memory may be a metal oxide semiconductor (MOS) field effect transistor (FET) with a floating gate, a MISFET, which stores bit information by including a carrier trap layer, such as a nitride film, in its gate insulator instead of a floating gate and which can store multiple values by one cell, or the like.

Now, operation performed in the semiconductor memory 10 will be described.

The operation of writing to the memory cells Mmn will be described first. Descriptions will be given with a case where the memory cell M02 is written as an example.

When the memory cell M02 is written in accordance with an address input from the address input section 12, voltage is applied to the word line WL0 by the X-direction decoder 15 and a plurality of memory cells M0n the gates of which are connected to the word line WL0 go into the ON state.

Then voltage is applied to the selection line SL2a by the Y-direction decoder 14 and the selection transistor S2a goes into the ON state. As a result, the bit line BL2 connected to the memory cell M02 connects with the virtual ground line VRG and the voltage of the bit line BL2 is at ground level. Similarly, voltage is applied to the selection line SL3b by the Y-direction decoder 14 and the selection transistor S3b goes into the ON state. As a result, the bit line BL3 connected to the memory cell M02 connects with the drain line DRL and voltage is applied to the bit line BL3 by the cascode circuit 17. The selection transistors S1a, S1b, S1c, S4a, S4b, S4c, S5a, S5b, S5c, . . . are put into the OFF state by the Y-direction decoder 14, so the bit lines BL1, BL4, BL5, . . . go into a floating state.

In this case, the drain line DRL and virtual ground line VRG may be connected to the bit lines BL2 and BL3, respectively, by the Y-direction decoder 14.

It is assumed that MOSFETs of a floating gate type are used as the memory cells Mmn. If drain voltage and gate voltage are, for example, 5 V and 10 V respectively, electrons will be injected into a floating gate in the memory cell M02 as a result of, for example, channel hot electron injection. Therefore, a threshold Vth rises and the memory cell M02 goes into a PGM state.

In the case of erasing, it is assumed that drain voltage and gate voltage are 5 V and −10 V respectively and that the source is in a floating state. Then electrons will flow out of the floating gate through a tunnel oxide film. Therefore, the threshold Vth drops and the memory cell M02 goes into an ERASE state.

Now, the operation of reading the memory cells Mmn will be described.

Descriptions will be given with a case where the memory cell M02 is read as an example. Voltage is applied to the word line WL0 and the memory cell M02 is put into the ON state. Then the virtual ground line VRG is connected to the bit line BL2 and the drain line DRL is connected to the bit line BL3. This is the same with the operation of writing described above. In this case, a voltage of, for example, 5 V is applied to the word line WL0 and a voltage of, for example, 1 V is applied to the drain line DRL connected to the bit line BL3.

In the embodiment of the present invention, unlike the prior art, the bit line BL4 is not connected to the precharge line PRL but basically put into a floating state in the case of reading the memory cell M02. The bit line BL5 is charged instead. That is to say, voltage is applied to the selection line SL5c to put the selection transistor S5c into the ON state. By doing so, the bit line BL5 connected to the memory cell M04 is connected to the precharge line PRL. Then the bit line BL5 is charged by a current source included in the precharge circuit 18 so that the potential of the bit line BL5 will be equal to that of the bit line BL3.

Moreover, the bit line BL4 in a floating state is connected to the precharge line PRL only for a certain period of time. That is to say, voltage is applied to the selection line SL4c by the Y-direction decoder 14 to put the selection transistor S4c into the ON state. By doing so, the bit line BL4 is connected to the precharge line PRL. Then the bit line BL4 is charged by the current source included in the precharge circuit 18 so that the potential of the bit line BL4 will be equal to that of the bit lines BL3 and BL5.

Regardless of the storage states of the memory cell M02 and the memory cell M03 adjacent to it, this prevents the electric current Ic from flowing from the bit line BL3 on the drain d1 side of the memory cell M02 to the bit line BL4 and prevents an electric current from flowing from the bit line BL4 to the bit line BL3.

Figure 4:
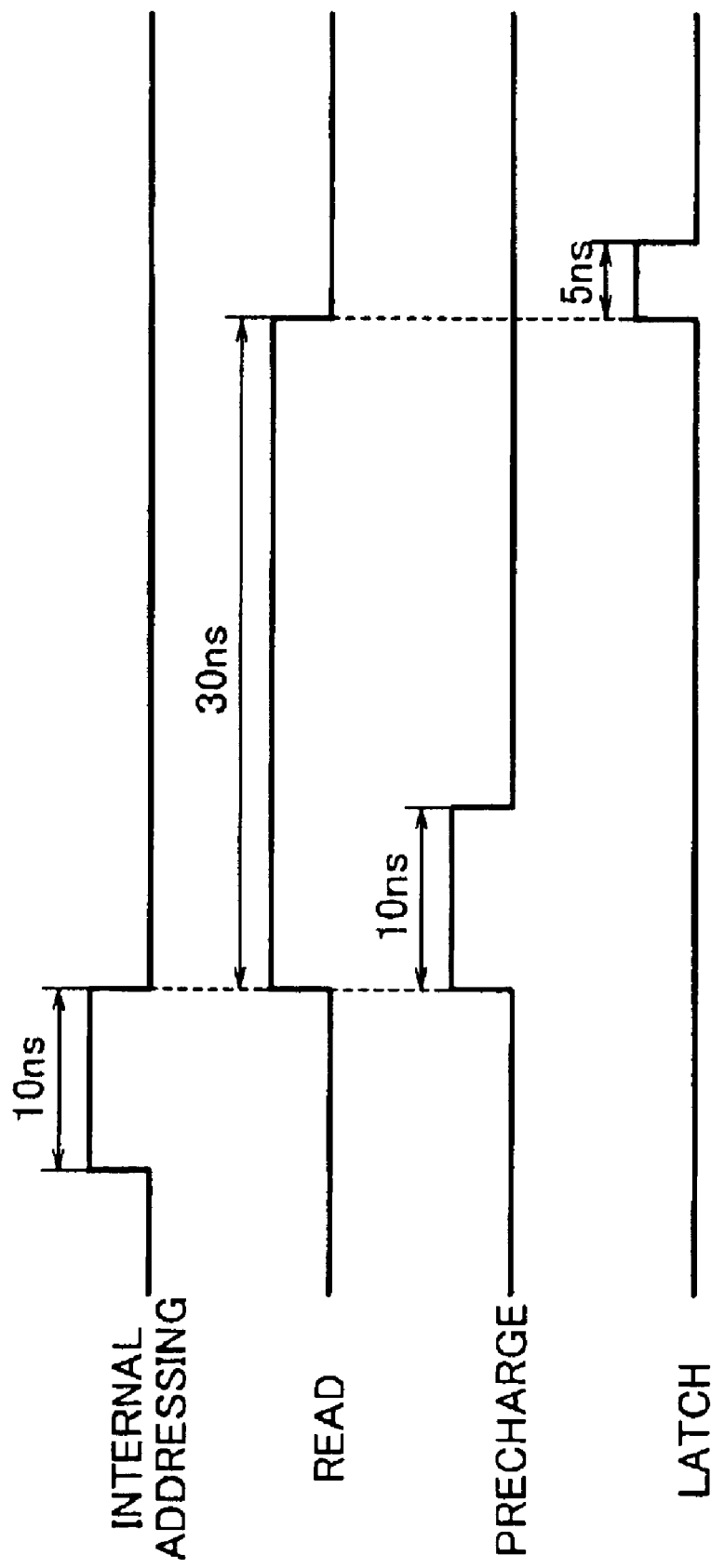
FIG. 4 is a time chart at read time.
Figure 5:
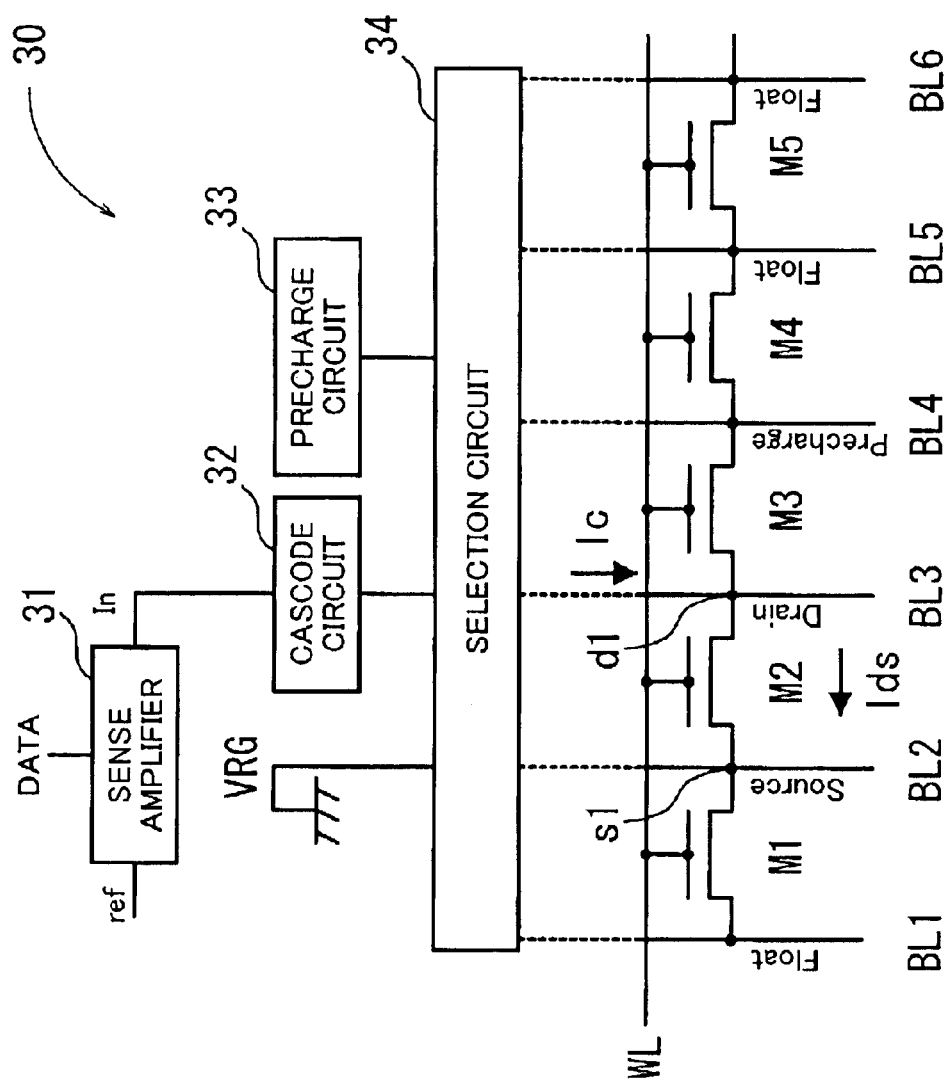
FIG. 5 is a view showing the rough structure of part of a conventional nonvolatile semiconductor memory based on a virtual ground method.
Figure 6:
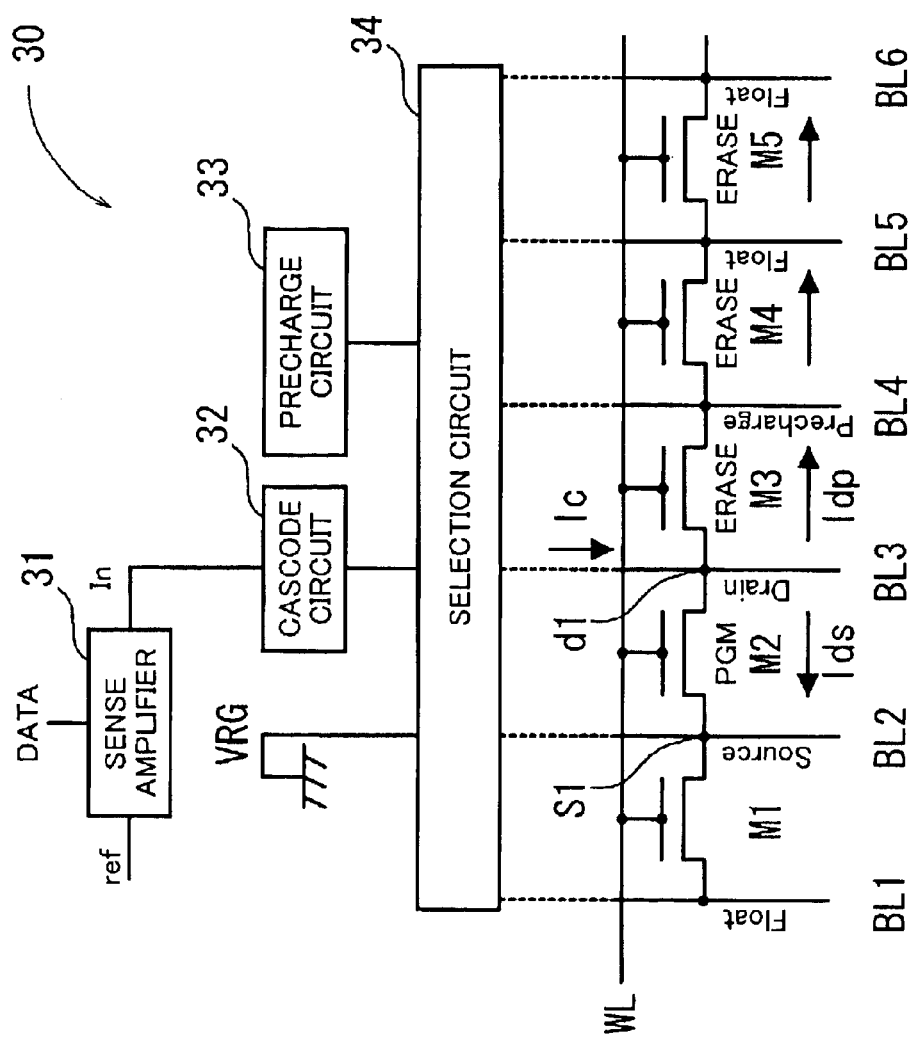
FIG. 6 is a view showing the rough structure of part of the conventional semiconductor memory in which a combination of storage states of memory cells is made.
Figure 7:
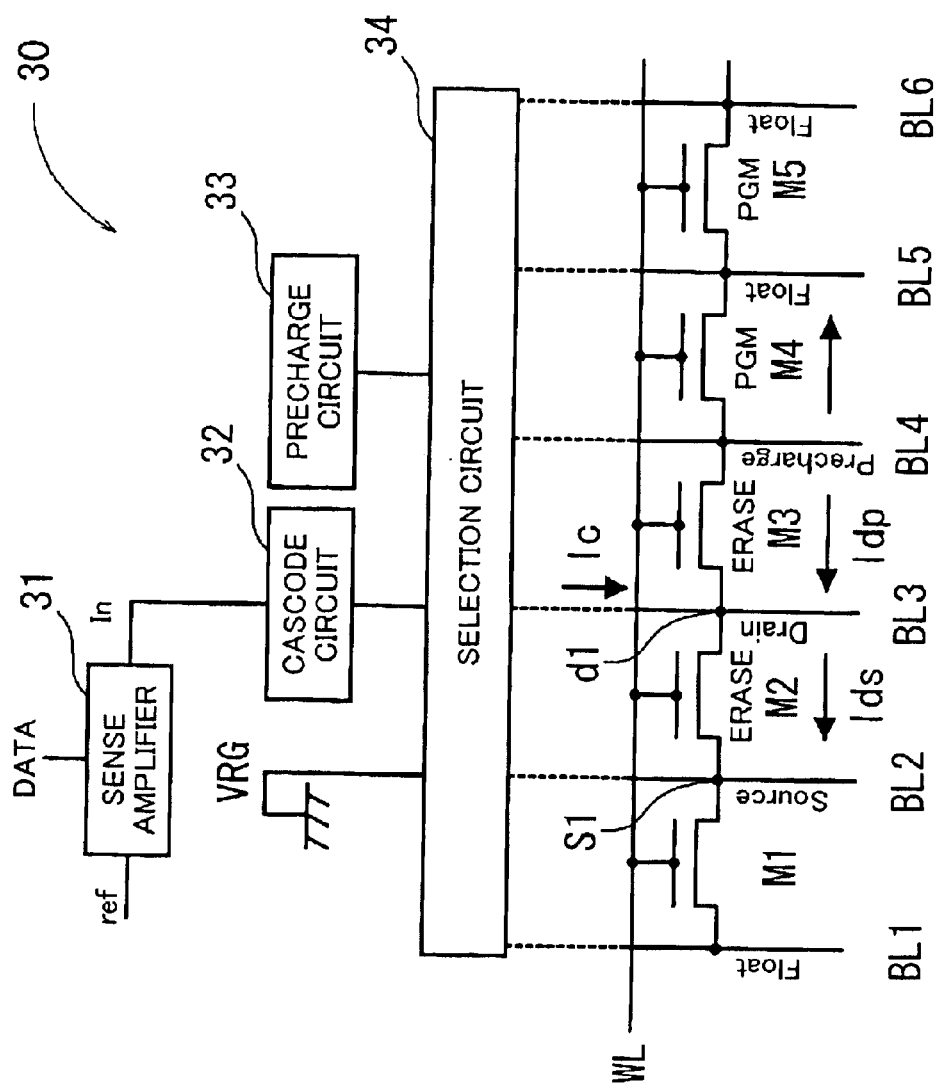
FIG. 7 is a view showing the rough structure of part of the conventional semiconductor memory in which another combination of storage states of memory cells is made.

FIG. 4 is a time chart at read time.

As shown in FIG. 4, internal addressing will be performed first to determine a memory cell Mmn to be read. That is to say, a memory cell Mmn is selected by the Y-direction decoder 14 and X-direction decoder 15. For example, when the memory cell M02 is selected, reading begins.

In this case, the selection transistor S2a is put into the ON state by the selection line SL2a and the bit line BL2 is connected to the virtual ground line VRG. The selection transistor S3b is put into the ON state by the selection line SL3b and the bit line BL3 is connected to the drain line DRL. In addition, the selection transistor S5c is put into the ON state by the selection line SL5c and the bit line BL5 is connected to the precharge line PRL.

As shown in FIG. 4, it is assumed that read time is 30 ns. During the first portion of reading, that is to say, during the first 10 ns, a precharge signal is sent to the selection line SL4c to connect the bit line BL4 in a floating state and the precharge line PRL and to charge the bit line BL4.

The cascode circuit 17 converts the electric current Ic which runs through the bit lines BL3 into voltage. The sense amplifier 20 compares this voltage and a reference signal input from the reference circuit 19 to judge the storage state ("0" or "1") of the memory cell M02.

In this case, the sense amplifier 20 latches a judgment result ("0" or "1") for a certain period of time (in this example, 5 ns) and then outputs it to the output circuit 21.

As stated above, in the case of reading, charging the bit line BL4 in a floating state between the drain d1 and the charged bit line BL5 for a certain period of time will prevent an electric current from flowing into and out of the memory cell M02. The sense amplifier 20 therefore can read a correct value regardless of the storage states (a PGM or ERASE state) of the memory cell M02 and the memory cell M03 adjacent to it.

By the way, the above voltage and current values are simple examples and voltage and current values are not limited to them.

Descriptions have been given with a case where the bit line BL4 in a floating state is charged by the current source included in the precharge circuit 18 as an example. However, the bit line BL4 in a floating state may be charged by the current source included in the cascode circuit 17. In this case, a precharge signal is input to the selection line SL4b for a certain period of time during read time to put the selection transistor S4b into the ON state. As a result, the drain line DRL and bit line BL4 are connected.

As has been described in the foregoing, in the present invention, a bit line in a floating state between a drain in a memory cell to be read and a charged bit line is charged only for a certain period of time. This prevents an electric current from flowing from the drain in the memory cell to be read to another memory cell and prevents an electric current from flowing from another memory cell to the drain in the memory cell to be read. Therefore, a decrease in margin at read time can be prevented.

The foregoing is considered as illustrative only of the principles of the present invention. Further, since numerous modifications and changes will readily occur to those skilled in the art, it is not desired to limit the invention to the exact construction and applications shown and described, and accordingly, all suitable modifications and equivalents may be regarded as falling within the scope of the invention in the appended claims and their equivalents.

What is claimed is:

1. A nonvolatile semiconductor memory based on a virtual ground method, the memory comprising:
   a plurality of memory cells arranged like a matrix;
   a plurality of bit lines each connected to sources or drains of memory cells arranged in a column direction;
   a plurality of word lines each intersecting the plurality of bit lines and each connected to gates of memory cells arranged in a row direction;
   a current supply circuit configured to be continuously connected to a first bit line of the plurality of bit lines during a read time, wherein the first bit line is shared by a selected memory cell of the plurality of memory cells and a first non-selected memory cell of the plurality of memory cells, and the first bit line is connected to a drain of the selected memory cell, and wherein the current supply circuit is configured to supply an electric current to the first bit line during the read time;

a charge circuit unit for selectively charging a second bit line of the plurality of bit lines, wherein the charge circuit unit is configured to be selectively connected to the second bit line during the read time, and the second bit line is shared by the first non-selected memory cell and a second non-selected memory cell of the plurality of memory cells, and wherein the second bit line is connected to the charge circuit unit only for a certain portion of the read time, and the second bit line is in a floating state for a remaining portion of the read time; and a precharge circuit configured to be continuously connected to a third bit line of the plurality of bit lines during the read time, wherein the third bit line is shared by the second non-selected memory cell and a third non-selected memory cell of the plurality of memory cells, and the precharge circuit is configured to charge the third bit line during the read time.

2. The semiconductor memory according to claim 1, further comprising a sense amplifier connected in series with the current supply circuit for judging the storage state of the memory cell.

3. The semiconductor memory according to claim 1, wherein the charge circuit comprises the precharge circuit.

4. The semiconductor memory according to claim 1, wherein the charge circuit comprises the current supply circuit.

5. The semiconductor memory according to claim 1, wherein the current supply circuit comprises a cascode circuit.

6. The semiconductor memory according to claim 1, wherein the plurality of memory cells are MOSFETs with a floating gate.

7. The semiconductor memory according to claim 1, wherein the plurality of memory cells are MOSFETs with a gate insulator including a carrier trap layer.

8. The semiconductor memory according to claim 1, further comprising a timing circuit for generating a timing signal to charge the second bit line during the certain portion of the read time, wherein the certain portion of the read time is at a beginning of the read time.

* * * * *